HIGH POWER SEMICONDUCTOR SWITCH

Filed Oct. 27, 1961 2 Sheets-Sheet 1

WITNESSES:
Bernard R. Giegueny
Gordon H. Telfer

INVENTOR
Lee W. Smart
BY
Frederick Shapoe
ATTORNEY

Dec. 8, 1964 L. W. SMART 3,160,800

HIGH POWER SEMICONDUCTOR SWITCH

Filed Oct. 27, 1961 2 Sheets-Sheet 2

United States Patent Office 3,160,800
Patented Dec. 8, 1964

3,160,800

HIGH POWER SEMICONDUCTOR SWITCH

Lee W. Smart, Monroeville, Pa., assignor to Westinghouse Electric Corporation, East Pittsburgh, Pa., a corporation of Pennsylvania Filed Oct. 27, 1961, Ser. No. 148,083
5 Claims. (Cl. 317—235)

This invention relates generally to semiconductor switches and more particularly to semiconductor controlled rectifiers which are capable of handling relatively large amounts of current.

Semiconductor switches, particularly of the type known as semiconductor controlled rectifiers, have been widely applied for switching operations at low currents, but have not been extensively used in applications where the capability to handle currents of about 100 amperes and more is necessary. Previous devices were limited in their current handling capacity by the large temperature rise resulting from high current densities, inadequate means for thermal dissipation and fabrication problems encountered in attempting to scale-up existing designs for higher current.

The type of device to which the invention is particularly applicable is the four region, three terminal controlled rectifier wherein a potential is applied to terminals on the outer two regions so as to place the center junction in a reverse bias and hence off or nonconductive in the normal blocking state. A third terminal is disposed on one of the inner regions. A potential applied to the third terminal or gate contact causes minority carriers to be injected into the inner region until breakover at the center junction occurs to cause the device to go into a hyperconductive state.

When a large emitter current is carried by present devices considerable internal heat results which cannot be readily removed. Limitations on the present designs when operating at high currents result in an appreciable temperature rise which changes the operating characteristics of the device by reducing the breakover voltage and eventually may result in total failure.

Compact switch devices are desirable in many applications requiring controllable high power characteristics along with high efficiency. Such applications are, for example, in inverters and variable speed motor devices.

It is, therefore, an object of the present invention to provide a semiconductor controlled rectifier device capable of handling relatively high average currents such as those in excess of about 100 amperes.

Another object is to provide semiconductor controlled rectifier devices permitting relatively uniform current densities through the emitter so that localized heating is minimized.

Another object is to provide a semiconductor controlled rectifier with improved heat removal means.

Another object is to provide a high power semiconductor switch which may be readily fabricated.

According to the present invention a semiconductor switch is provided which comprises a plurality of regions of differing conductivity type, one of the outer regions (emitter) is disposed on a surface of a second region so as to substantially cover the entire area of that surface other than a portion at the periphery of the surface which portion is relatively small compared to the emitter area. The gate contact is made to the peripheral portion of the surface. In this way fullest utilization of the available surface area of the semiconductor wafer is made. The emitter is of large area and a contact may be readily bonded to its entire area in order to make the current density uniform. Furthermore, the emitter is continuous, rather than annular as in many prior designs, enabling by easy fabrication steps the affixing of adequate heat sinks thereto for thermal dissipation.

According to the preferred forms of the invention the emitter is a regularly shaped geometrical figure substantially like that of the second region, but with an indentation therein revealing a portion of the surface of the second region to which the gate contact is disposed and in which it is at least partially enclosed by the emitter.

The features of the present invention which are believed to be novel are set forth with particularity in the appended claims. The present invention, both as to its organization and method of fabrication, together with the above-mentioned and further objects and advantages thereof, may best be understood by reference to the following description, taken in connection with the accompanying drawings, in which:

FIGS. *4a* through *4g* are partial plan views showing alternative forms of gate and emitter configuration in accordance with the present invention; and FIG. *4h* is a plan view showing an additional modification of the invention.

Figure 1:
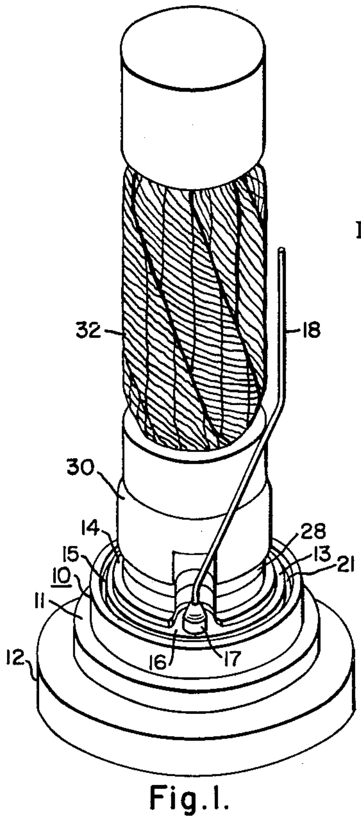
FIGURE 1 is a perspective view of a partially assembled high power semiconductor switch made in accordance with the present invention.

FIG. 1 shows a partially assembled, but unencapsulated switch in accordance with this invention. A semiconductor device 10 is mounted upon a contact 12 of a suitable conductive metal such as molybdenum for making electrical contact to the lower surface of the device 10. A joining member 11 of aluminum forms the bond between the device 10 and the contact 12. The uppermost region 14, or emitter, is disposed on a second region 15 and substantially covers the entire surface of the second region except for a portion 16 at the periphery thereof to which is bonded an ohmic contact 17 serving as the gate contact to the device.

In terminology generally used in describing controlled rectifiers, each of the outermost semiconductive regions is frequently referred to as an emitter. In the present discussion, however, the term, unless otherwise indicated, refers to the emitter-cathode rather than the emitter-anode.

There is connected to the emitter 14 over its entire surface a contact 30 of large mass of a suitable highly conductive metal which extends up to and is joined with a flexible lead assembly 32 of large cross section. A wire lead 18 is bonded to the gate contact 17 for applying electrical signals thereto.

Figure 2:
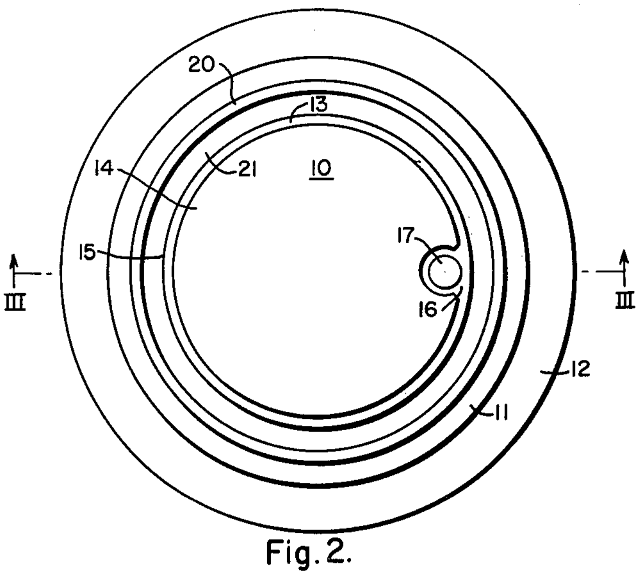
FIG. 2 is a plan view of the semiconductor switch itself showing some of the features of the present invention.
Figure 3:
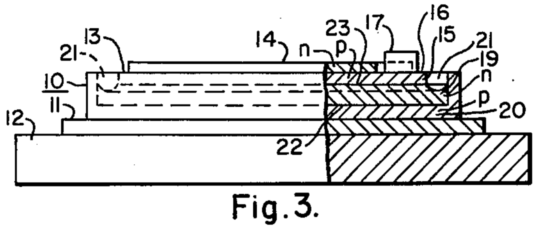
FIG. 3 is an elevation view, partially in cross-section, of the device of FIG. 2 taken along the line III—III.

Referring now to FIGS. 2 and 3, further aspects of the invention will become apparent. The semiconductor switch illustrated is that of the four layer three terminal type such as that known commercially as the Trinistor controlled rectifier. As is usual, the lower three layers 15, 19 and 20 of the device 10 are formed by diffusion of a p-type impurity into the surface of an n-type wafer with the subsequent etching of a groove 21 through the p-type upper surface to separate the diffused layer and form two separate junctions 22 and 23.

The fourth region or emitter 14, as was described in connection with FIG. 1, is in a configuration substantially conforming to that of the next region 15, but with an indentation therein for the location of the gate contact 17.

It will be noted that the emitter 14 is not shown extending completely to the edge of the surface of the second region 15. The portion 16 is left exposed so that the gate contact 17 may be made thereto. In addition there is a peripheral strip 13 which is unused. The strip 13 is about 0.020 inch wide and is made necessary by certain techniques employed to mask the semiconductor surface for the formation of the chemically etched groove 21. It is not desirable from the standpoint of current handling capacity to leave the strip 13 unused. However, a device of adequate capacity may often be fabricated more conveniently if the total semiconductor surface is not completely utilized. An important feature which improves the current carrying capacity over prior art devices is that the emitter 14 is substantially of the same shape and size as the surface of the region 15 except for the portion 16. It is to be understood that an emitter contact may be formed extending entirely to the edge so long as other means for forming the groove 21 are employed. Alternatively, of course, the groove could be formed prior to the fusion of the emitter 14 onto the structure. It will be noted that the emitter and gate contacts 14 and 17 have in their total outline the shape of a circle like that of the second region and hence utilize to the fullest extent practicable the surface area of the second region 15.

By more fully utilizing the surface area of the second region 15 it is possible to achieve more uniform current densities for a particular size semiconductor device to minimize localized heating or "hot spots." It's now possible to make electrical contact to the entire surface of the emitter 14. Consequently, the heat generated in the emitter is more uniform. The fact that the gate contact 17 is located at the periphery of the surface permits a connection to be made to it readily as opposed to designs in which the gate contact is located in the center of the emitter. Also, this configuration permits a large massy contact 30, as shown in FIG. 1, to be readily joined to the entire surface of the emitter 14 so that efficient removal of heat generated in the emitter 14 is possible.

Another advantage of the present invention is the relative ease by which a high power controlled rectifier may be fabricated. The method of fabrication need be varied from that for lower power level devices only in the arrangement of the emitter and gate contacts 14 and 17. Fuller utilization of the semiconductor surface by the emitter 14 would be possible if the gate contact 17 could be made to region 15 other than on the same surface. However, the thickness of the diffused region 15 does not permit contact to be readily made at the edge surface of the region 15 which is a part of the wall of groove 21. Furthermore, new configuration for the lower three regions 15, 19 and 20 is not desired since new fabrication techniques would have to be developed. The present invention permits a considerable improvement in current carrying capacity while requiring relatively little change in device design and fabrication. Nevertheless the teachings of the present invention are not restricted to a device having a particular configuration of the lower regions since provision of the gate contact on the same surface as the emitter may still be necessary.

It would, of course, greatly ease the problem of providing high power semiconductor switches if large area semiconductor wafers were readily available at low cost. However, at the present time commercially available wafers are limited to about 1 inch in diameter. Therefore, the problem is to get the maximum current handling capacity out of a limited area device. It is true that semiconductor switches are frequently used in applications where currents are so small that the problems of maximum current limit and thermal dissipation are not important. In such cases, small area devices are quite adequate for the needs of the application. For a high power semiconductor switch as that to which the present invention is primarily directed, a large area wafer should be employed such as that having a diameter of about ½ inch or greater or an area of about 0.2 square inch or more. It is, of course, to be understood that in any application where compactness of the switching device is an essential quality, the features of the present invention for fully utilizing the semiconductor device are applicable in any size range and for any power level.

There will now be described a more particular example of the structure and fabrication of the device in accordance with the present invention. Still referring to FIGS. 1, 2 and 3, a silicon disc is obtained having a diameter of about 1 inch. The initial disc of n-type and p-type layers are formed on all the exposed surfaces by vapor phase diffusion of aluminum into the silicon forming p-n rectifying junctions 22 and 23. The depth of the diffused layers is approximately 0.0025 inch to 0.0031 inch. The diffusion is carried out in an evacuated sealed tube wherein the lapped and chemically etched silicon disc is inserted along with an aluminum silicon impurity source and sealed-off under vacuum. The tube is heated in a furnace for an amount of time calculated to produce a diffused layer of desired depth.

In order to achieve an n-p-n-p configuration as shown another region of n-type must be added to one of the diffused p-type layers. This is done alloying an n-type gold-antimony disc (emitter 14) having a diameter of about ¾ inches and a thickness of about 0.0015 inch, thus forming a third p-n junction. An ohmic control contact or gate contact 17 having a diameter of about 100 mils is affixed within the recess formed by the indentation in the emitter 14 which has a diameter of about 125 mils.

It is to be understood that the gap between the gate 17 and emitter 14 is chosen for a particularly desired firing characteristic. That is, the larger the gap the greater the gate firing voltage. Hence, the gap may be minimized in order to maximize the current handling capacity if reduction in firing voltage can be tolerated. The size of the gate contact is, preferably made as small as possible, that is, as small as is sufficient to carry the necessary switching current yet large enough so that a lead or the like may be bonded thereto. The gate contact 17 is of molybdenum, as is the contact 12 which is a layer of material shaped like the silicon disc bonded over its entire lower surface area by means of the aluminum disk 11. An aluminum disk (not shown) is also used to join the gate 17 to the semiconductor. The alloyed regions, namely, the emitter 14, the contact 12 and the gate contact 17 are simultaneously preformed using mold fusion techniques and a controlled heat cycle to approximately 720° C. peak temperature.

After the fusion operation the semiconductor is cleaned and a circular groove 21 approximately 20 mils wide is chemically etched into the exposed silicon surface to a depth of about 5 to 6 mils. This operation separates the diffused skin on the wafer into the two p-type layers 15 and 20. An etching fixture of an unreactive material is used to mask the surrounding semiconductor material. Thereafter, the groove is filled with an insulating material (not shown) such as a silicone varnish or other resinous composition to protect the exposed junction therein.

Copper contact 30 is joined to the upper side of the device, a relatively thick molybdenum disc 28 being employed to prevent damage to the silicon due to stresses arising from thermal expansion of the copper. A copper stud (not shown) is also bonded to the lower surface of contact 12. The various bonding operations are performed with a solder such as a tin-silver solder. After attachment of the flexible lead 32, the gate leads 18 and the copper stud 34, the assembly is sealed within a ceramic seal after testing and is ready for operation.

Devices such as that just described have been found capable of conducting 200 average amperes in the forward direction at a maximum junction temperature of about 150° C. Peak currents up to 1750 amperes for 8 cycles and 3000 amperes for 1 cycle have been sustained.

FIG. 2 shows a circular emitter 14 and gate contact 17 which have been found to be easily fabricated. However, it is to be understood that additional forms of emitter and gate contacts provide the features of full utilization of the semiconductor surface area and ease of attachment to both the emitter and gate, in accordance with this invention.

For example, in FIGS. 4*a* through 4*g* are shown partial plan views of alternative forms of the contacts 14 and 17. Certain variation is provided merely in the shape of the indentation in the emitter contact without changing the shape of the gate contact. It will be noted that in FIG. 2 the indentation in the emitter 14 is in the form of a true circle enlarged by breaking off the thin section at the periphery in order to readily make contact to the gate.

Figure 4A:
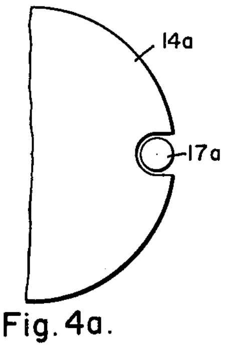
Figure 4B:
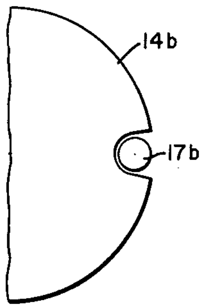

In FIG. 4*a* this is modified by merely extending outwardly the indentation in the emitter 14*a*. In FIG. 4*b* it is shown that the indentation in the emitter 14*b* may be widened at its mouth. Of course, any such modification in this direction, intended to make it even easier to apply the gate contacts 17*a* and 17*b*, is obtained at the result of some sacrifice of emitter area.

Figure 4C:
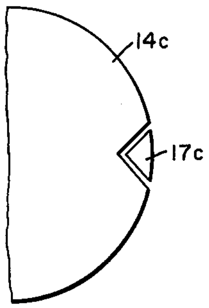
Figure 4D:
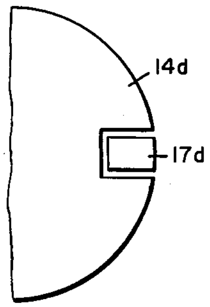

In FIG. 4*c* and FIG. 4*d* there are shown embodiments which quite fully utilize the available area by providing gate contacts 17*c* and 17*d* of exactly the same shape as the indentations in the emitters 14*c* and 14*d*.

Figure 4E:
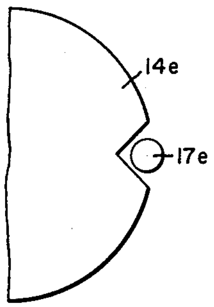

The embodiments of 4*a* through 4*d* have substantially a constant gap between the emitter and gate so that breakdown or switching may occur at any point upon the periphery of the emitter contact. Of course, in 4*a* and 4*b* at the outer extremity of the emitter indentation the gap is considerably wider and switching at those points is unlikely to occur. However, considerable gap length is available for switching. In any case in which it is desired to limit the possible switching area an embodiment like that of FIG. 4*e* may be provided wherein the triangular notch in the emitter 14*e* partially encloses a circular gate contact 17*c* with the result that the two closest points are at the middle of the sides of the triangular notch. Hence, switching is more likely to occur at these points than at any others resulting in more careful control of the switching characteristic. That is, in such embodiments as 4*a* through 4*d* any misalignment between the gate and emitter which places the gate more closely to the emitter at one point than at another will alter the switching characteristics so that it occurs at that closest point a large number of times. Hence, great care must be taken to the contacts in order to have precise control of the breakover characteristic. In the embodiment of FIG. 4*e* the alignment process would be less critical since there are only two important points to consider. However, it will be noted that some sacrifice in the possible emitter surface area is made in FIG. 4*e* since the gate contact extends partially outward from the indentation. This may be avoided by using a gate contact whose outer edge conforms with general outline of the emitter; that is, reduce the gate to approximately a semicircle.

Figure 4F:
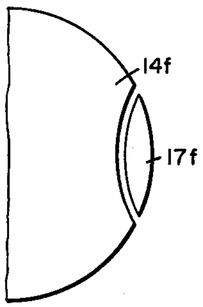
Figure 4G:
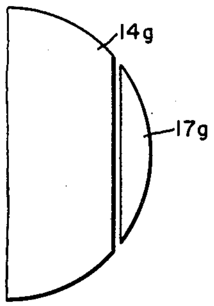

FIGS. 4*f* and 4*g* show other forms of the invention which effectively utilize the total available surface area. FIG. 4*f* has only a shallow indentation in the emitter 14*f*. In FIG. 4*g* the emitter 14*g* actually has no indentation therein, but is merely chopped off at one side. However, the essential principles of the invention are applicable, that is, full utilization of the surface area of the semiconductor and peripheral disposition of the gate contact for ease in making contacts thereto. The embodiments of FIGS. 4*f* and 4*g* may, however, not be preferred over others described because in order to get the necessary width to make a gate contact 17*f* or 17*g* a large portion of the emitter 14*f* or 14*g* may have to be removed with the result that some possible emitter surface area is sacrificed.

Figure 4H:
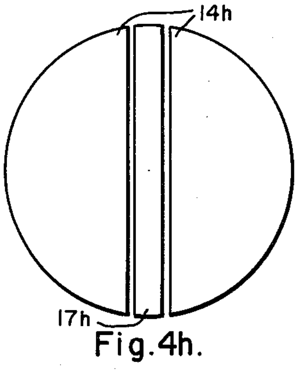

FIG. 4*h* shows a form of the invention which is rather different than those previously described, but which still provides the features of full utilization of semiconductor surface area and peripheral disposition of the gate contact for use in making connections thereto. Here, however, the gate 17*h* extends all the way through the emitter 14*h* which is separated into two separate parts. The purpose of this form is to achieve fast switching time while still preserving high power capacity. It is believed that quicker switching results when the gate contact is disposed a short distance from all portions of the emitter. The previously described embodiments obviously are not directed toward fast switching since the gate is at an extreme position on the emitter. However, for high power applications this is satisfactory since fast switching times are not generally needed. The device of the specific example (FIGS. 1–3) has been found to have a switching time of about 4–6 microseconds adequate for almost all applications. However, the embodiment of FIG. 4*h* is shown as a means of providing a faster switching time if absolutely necessary. The gate contact 17*h* may be kept as thin as possible so that a fine wire may be laid down and bonded thereto. It is probable, however, that some loss in emitter surface area will result from this type of contact and it is not preferred for the usual high power application. A modification of FIG. 4*h* which may be an adequate design compromise for some purposes is to extend the gate contact only partly through the emitter. In either case a large mass contact would be bonded to the entire surface of the emitter.

The modifications of FIGS. 4*a*–4*h* all use a generally circular emitter as in FIGS. 1–3. However, where semiconductor wafers of other shapes are employed, the emitter preferably should have a shape conforming thereto for achievement of high current carrying capacity.

A general feature of the modifications of this invention is that the emitter and hence the emitter junction has a considerably greater area than the gate, preferably about 25 times or more greater.

It is to be noted that the practice of the present invention is not limited to particular semiconductive materials nor to particular semiconductivity types for the various regions. For example, semiconductive germanium as well as III–V and II–VI compounds are possible for use besides silicon. A p-n-p-n device is suitable as well as the n-p-n-p type device shown. Also additional regions may be included such as a high resistivity region to form an n-p-i-p-n.

Various forms of the present invention have been shown and described in order to indicate how the needs of a particular application may be met by slight modification. It will, of course, be obvious to those skilled in the art that the described forms of the invention are not limiting and that various other changes and modifications may be made without departing from the spirit and scope of the invention.

I claim as my invention:

1. A semiconductor switch comprising: four successive regions of alternate semiconductivity type including a first outer region adjacent a second region with a rectifying junction therebetween; said first outer region being disposed on a surface of said second region and having an indentation in the periphery thereof leaving uncovered a peripheral portion of said surface of said second region; a first ohmic contact on said surface within said indentation and a second ohmic contact substantially over the entire surface of said first outer region.

2. A semiconductor switch comprising: a plurality of regions of differing semiconductivity type including a fused first region on a diffused second region with a rectifying junction therebetween, said first region having a geometrical configuration substantially like that of a surface of said second region other than an indentation leaving uncovered a portion at the periphery of said surface of said second region; an ohmic contact disposed on said surface within said indentation, said first region capable of serving as an emitter of carriers into said second region and said ohmic contact capable of serving as a gate contact which by application of a suitable potential thereto permits switching action; and an electrical contact member joined to said fused first region substantially over the entire surface thereof.

3. A high power semiconductor controlled rectifier capable of sustaining high currents without failure comprising: at least four regions of differing conductivity including an emitter region of a metallic alloy fused to a base region and forming a p-n junction therewith having an area of at least about 0.2 square inch; said emitter having an area and shape approximately like that of said base except for an indentation leaving uncovered a peripheral portion of the surface of the base; said base surface having a total area at least about twenty-five times greater than that of said peripheral portion; a gate contact on said peripheral portion of said base surface substantially conforming to the shape thereof and partially enclosed within said indentation so as to permit fuller utilization of the base surface area and to permit easy lead connection to said gate contact; a first electrical contact means of a metal having an end surface substantially like that of said emitter and bonded thereto so as to provide high current carrying capacity and good thermal dissipation; and a second electrical contact means of a conductive wire bonded to said gate contact.

4. A high power semiconductor controlled rectifier capable of sustaining high currents without failure comprising: a semiconductor structure of at least four regions of differing semiconductivity type including an emitter region of a metallic alloy fused to a circular base region and forming a p-n junction therewith having an area of at least about 0.2 square inch; said emitter having an area and shape approximately like that of said base except for an approximately circular indentation leaving uncovered a peripheral portion of the surface of the base, said base surface having a total area at least about twenty-five times greater than that of said portion; a circular gate contact on said peripheral portion of said base surface substantially conforming to the shape thereof and partially enclosed within said indentation so as to permit fuller utilization of the base surface area for the emitter in order to increase current handling capacity while permitting easy lead attachment to said gate contact; a first electrical contact means including a member of a conductive metal having a cross-sectional configuration as large as that of said emitter and a thickness very large compared to the thickness of said emitter, said member bonded to said emitter over its entire surface so as to provide high current carrying capacity and good thermal dissipation; and a second electrical contact means comprising a conductive wire bonded to said gate contact.

5. A semiconductor controlled rectifier capable of carrying relatively large currents comprising: a semiconductive wafer having a bulk material and a diffused surface layer; a groove describing a closed loop extending through said surface layer on a first major surface of said wafer to separate said surface layer into first and second separate diffused regions each forming a p-n junction with said bulk material; a fused fourth region on said first major surface of said wafer surrounded by said groove and forming a third p-n junction with said first diffused region, said fused region having a geometrical configuration substantially like that of the surface of said first diffused region other than a portion at the periphery thereof, said fused region having an area at least about twenty-five times the area of said portion; and an ohmic contact disposed on said portion of said surface so that said ohmic contact is partially enclosed by said fused region with which it forms an outline substantially like that of said first diffused region; said fused region capable of serving as an emitter of carriers into said first diffused region and said ohmic contact capable of serving as a gate contact which by application of a suitable potential thereto permits switching said controlled rectifier from a blocking state to a hyperconductive state; first electrical contact means including a member of a conductive metal having a cross-sectional configuration like the outline of said fused region and a thickness very large compared to the thickness of said fused region bonded to substantially the total area of said fused region so as to provide high current carrying capacity at uniform current densities with good thermal dissipation; and second electrical contact means comprising a conductive wire bonded to said ohmic contact.

References Cited in the file of this patent

UNITED STATES PATENTS

| | | |
|---|---|---|
| 2,842,723 | Koch et al. | July 8, 1958 |
| 2,933,662 | Boyer et al. | Apr. 19, 1960 |
| 2,936,409 | Jackson et al. | May 10, 1960 |
| 2,956,912 | Kroger et al. | Oct. 18, 1960 |
| 2,980,832 | Stein et al. | Apr. 18, 1961 |